(12) United States Patent
Kim et al.

(10) Patent No.: US 10,772,207 B2
(45) Date of Patent: Sep. 8, 2020

(54) FLEXIBLE SEMICONDUCTOR PACKAGE AND METHOD FOR FABRICATING THE SAME

(71) Applicant: Magnachip Semiconductor, Ltd., Cheongju-si (KR)

(72) Inventors: Kyeong Su Kim, Seoul (KR); Shin Park, Suwon-si (KR); Jae Jin Lee, Kumi-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/951,731

(22) Filed: Apr. 12, 2018

(65) Prior Publication Data

US 2019/0075656 A1    Mar. 7, 2019

(30) Foreign Application Priority Data

Sep. 1, 2017  (KR) .................. 10-2017-0112022

(51) Int. Cl.
*H05K 1/14*  (2006.01)
*H01L 23/498*  (2006.01)
*H05K 1/02*  (2006.01)

(52) U.S. Cl.
CPC ......... *H05K 1/147* (2013.01); *H01L 23/4985* (2013.01); *H05K 1/0271* (2013.01); *H01L 2224/16225* (2013.01); *H01L 2224/32225* (2013.01); *H01L 2224/73204* (2013.01); *H01L 2924/181* (2013.01); *H01L 2924/3511* (2013.01); *H05K 2201/0154* (2013.01); *H05K 2201/09018* (2013.01); *H05K 2201/10128* (2013.01); *H05K 2201/10681* (2013.01)

(58) Field of Classification Search
CPC .. H05K 1/147; H05K 1/0271; H01L 23/4985; H01L 2224/16225; H01L 2224/32225; H01L 2224/73204
USPC .......................................................... 361/749
See application file for complete search history.

(56) References Cited

U.S. PATENT DOCUMENTS

| 8,575,746 B2 | 11/2013 | Lee et al. | |
| 9,713,256 B2 | 7/2017 | Jeon | |
| 10,159,155 B2 * | 12/2018 | Ogasawara | H05B 33/0803 |
| 2009/0096095 A1 * | 4/2009 | Ishido | H01L 21/563 |
| | | | 257/737 |
| 2016/0056091 A1 * | 2/2016 | Kim | H01L 23/552 |
| | | | 257/368 |
| 2016/0079112 A1 * | 3/2016 | Itonaga | H01L 21/6836 |
| | | | 156/272.2 |
| 2018/0009197 A1 * | 1/2018 | Gross | B32B 17/064 |
| 2018/0098427 A1 * | 4/2018 | Park | H05K 1/0393 |

* cited by examiner

*Primary Examiner* — Tremesha S Willis
(74) *Attorney, Agent, or Firm* — NSIP Law

(57) ABSTRACT

A semiconductor package attached to a curved display panel includes a semiconductor chip, having a top surface and a bottom surface, disposed on a curved flexible film, wherein the curved flexible film is disposed on the curved display panel, a flexible cover layer attached to the top surface of the semiconductor chip, and an underfill material formed between the semiconductor chip and the curved flexible film, and wherein the top surface of the semiconductor chip is planar.

27 Claims, 13 Drawing Sheets

FLEXIBLE SEMICONDUCTOR PACKAGE AND METHOD FOR FABRICATING THE SAME

CROSS-REFERENCE TO RELATED APPLICATIONS

This application claims the benefit under 35 U.S.C. 119(a) of Korean Patent Application No. 10-2017-0112022 filed on Sep. 1, 2017 in the Korean Intellectual Property Office, the entire disclosure of which is incorporated herein by reference for all purposes.

BACKGROUND

1. Field

The following description relates to a flexible semiconductor package. The following description also relates to a method for fabricating such a flexible semiconductor package. The following description relates, in particular, to a Chip on Film (COF) semiconductor package with a characteristic of flexibility.

2. Description of Related Art

A flexible display is a next-generation display device that is transformable. Such a flexible display has the properties of being foldable or bendable, by contrast to a flat panel display.

The flexible display may improve the use of space by its ability to achieve transformation of a shape and is characterized by thinness, lightness, and lack of fragility, so the flexible display is applied in various industries, such as smartphones, wearable smart devices, displays, and digital signage for automobiles.

The flexible display is driven by a display driver IC, and the display driver IC is classified into being a source driver IC and a gate driver IC. In further detail, the source driver IC supplies voltages corresponding to each color value, and the gate driver IC receives and supplies the voltages to corresponding pixels.

However, contrary to properties of a flexible display, display driver ICs of alternative art lack flexibility, so there is an issue with direct attachment to the flexible display of the display driver ICs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor package attached to a curved display panel includes a semiconductor chip, having a top surface and a side surface, disposed on a curved flexible film, wherein the curved flexible film is disposed on the curved display panel, a flexible cover layer attached to the top surface of the semiconductor chip, and an underfill material formed between the semiconductor chip and the curved flexible film, and wherein the top surface of the semiconductor chip is planar.

The flexible cover layer may be formed to cover the top surface and the side surface of the semiconductor chip.

The semiconductor chip may have a thickness of 50 to 250 μm.

The flexible cover layer may have a thickness of 0.1 to 0.8 mm.

The flexible cover layer may include a mixture of a non-conductive silicon-based material and a conductive filler material.

The flexible cover layer may further include resin material.

A percentage of the non-conductive silicon-based material in the flexible cover layer may be greater than a percentage of the conductive filler material in the flexible cover layer.

The filler material may be any one or any combination of any two or more of alumina, aluminum nitride, boron nitride, carbon nitride, graphene, and diamond.

The semiconductor package may further include metal wires formed on the flexible film comprising terminals configured to accept the semiconductor chip.

The semiconductor package may further include bumps formed on the metal wires, wherein the bumps connect the metal wires to the semiconductor chip.

The semiconductor package may further include solder resist formed on the metal wires to cover a complete area, except for the terminals, of the metal wires.

The semiconductor chip may include a source driver IC or a gate driver IC.

The underfill material may have a higher viscosity than the flexible cover layer.

The underfill material may include non-conductive silicon-based materials and conductive filler materials.

The flexible cover layer may have a shape of a tape.

The underfill material and the flexible cover layer may include a same material.

In another general aspect, a semiconductor package attached to a curved display panel includes a semiconductor chip having a top surface and a bottom surface disposed on a curved flexible film, wherein the curved flexible film is disposed on the curved display panel, an underfill material formed between the semiconductor chip and the curved flexible film, and a flexible cover layer formed on the top surface of the semiconductor chip, and wherein the bottom surface of the semiconductor chip is curved.

The underfill material and the flexible cover layer may include a same material.

The underfill material and the flexible cover layer may include non-conductive silicon-based materials and conductive filler materials, and a percentage of the non-conductive silicon-based materials may be greater than a percentage of the conductive filler materials.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
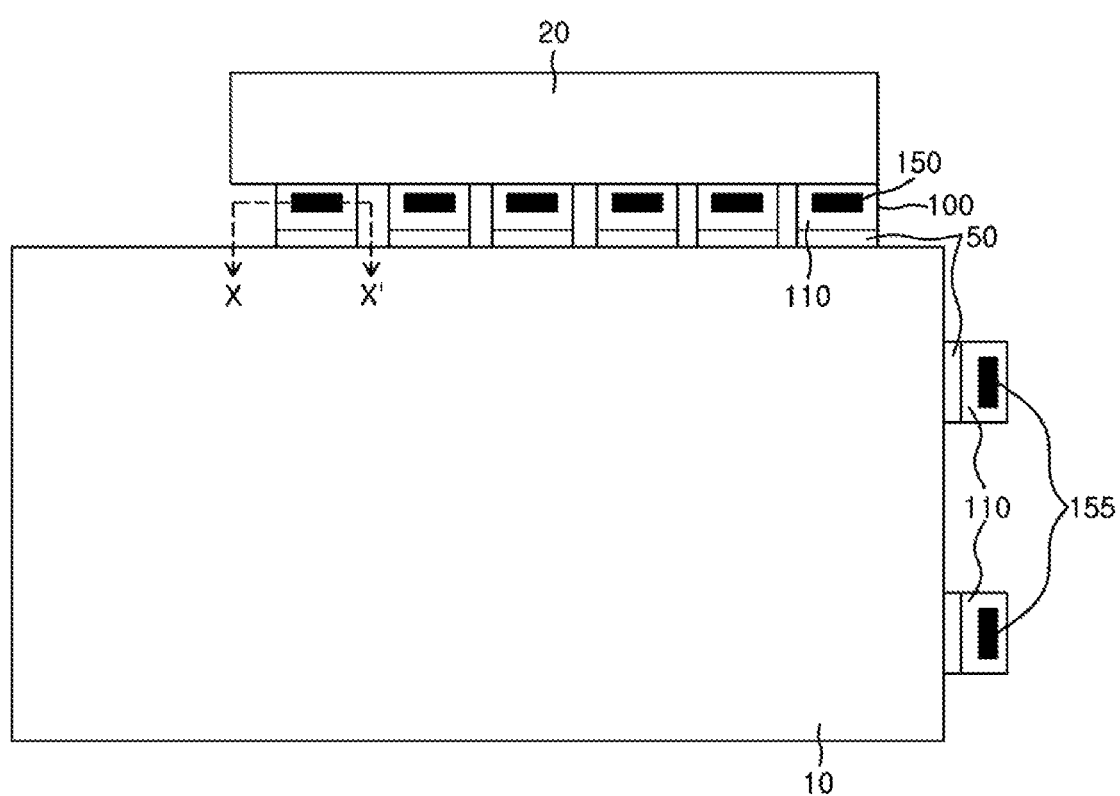
FIGS. 1A and 1B are diagrams of an example of a display driver IC connected to a rigid display panel.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Therefore, in alternative arts, there has been suggested a method in which display driver ICs are located at the surface of a flexible display and the display driver ICs are electrically connected to the flexible display via a plurality of signal lines to drive driver ICs regardless of a spatial transformation of the flexible display.

The semiconductor package of the examples minimizes a thickness of a semiconductor chip and adds a cover layer having flexibility to increase an adhesion between the semiconductor chip and a film so that a flexibility of the semiconductor package is increased. As a result, a radius of curvature of a semiconductor chip is minimized when the semiconductor package is transformed, and the possibility of low performance of or damage to the semiconductor chip will decrease.

In addition, the examples enable a flexible cover layer to be formed by the same manufacturing process as the underfill material, so a manufacturing process becomes simple and, in consequence, a possibility of a fault occurrence and cost for manufacturing is minimized.

The following description describes in greater detail a semiconductor package that is capable of being connected not only to a rigid display panel, but also to a curved display panel.

Figure 1B:
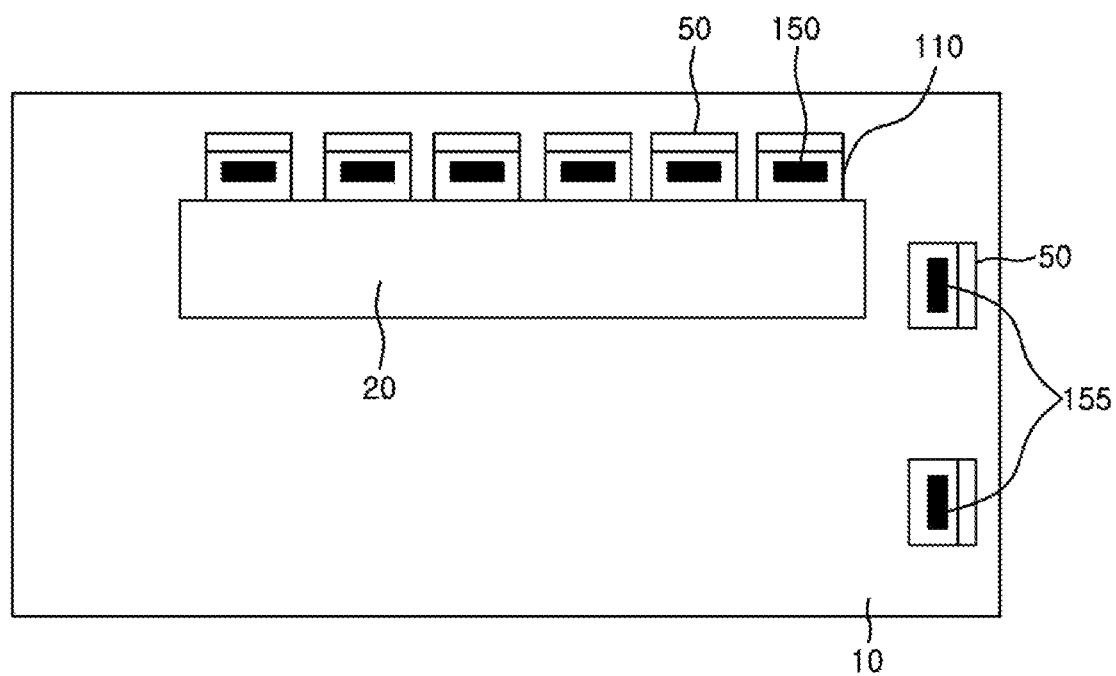

FIGS. 1A and 1B are diagrams of an example of a display driver IC connected to a rigid display panel.

Referring to the example of FIG. 1A, a display driver IC is a semiconductor package and includes a flexible film 110 connected to a rigid display panel 10, a plurality of semiconductor chips 150, 155, a PCB 20 connected to an input terminal of the semiconductor chips 150, and an output terminal or a lead 50 formed between the rigid display panel 10 and flexible film 110. For example, the display panel is a Liquid Crystal Display (LCD), a Plasma Display Panel (PDP), a Liquid Crystal on Silicon (LCoS), an Organic Light-Emitting Diode (OLED), or another, similar type of display panel. In such an example, the semiconductor chips 150 attached to the flexible film 110 are source driver ICs, and the semiconductor chips 155 attached to the flexible film 110 are gate driver ICs.

FIG. 1B is an example of a form in which the flexible film 110, the plurality of semiconductor chips 150, 155, and the PCB 20, illustrated in FIG. 1A, are folded and attached to a rear side of the curved display panel 10.

Figure 2:
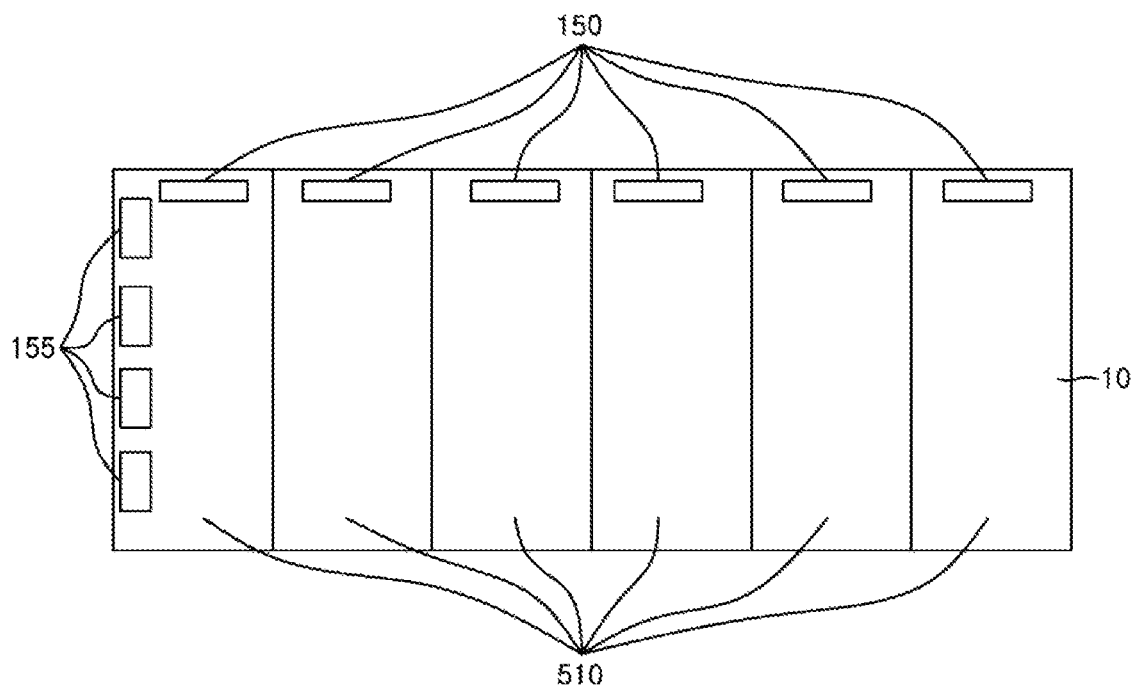
FIG. 2 is a diagram of an example of a display driver IC attached to a rear side of a rigid display panel.

FIG. 2 is a diagram of an example of a display driver IC attached to a rear side of a rigid display panel.

Referring to the example of FIG. 2, there are a plurality of semiconductor chips 150, 155 attached to a second surface of a rigid display panel 10. In the example of FIG. 2, the semiconductor chips 150 are a source driver IC, and the semiconductor chips 155 are gate driver ICs. Also, there are pixel regions 510 corresponding to each source driver IC.

Figure 3A:
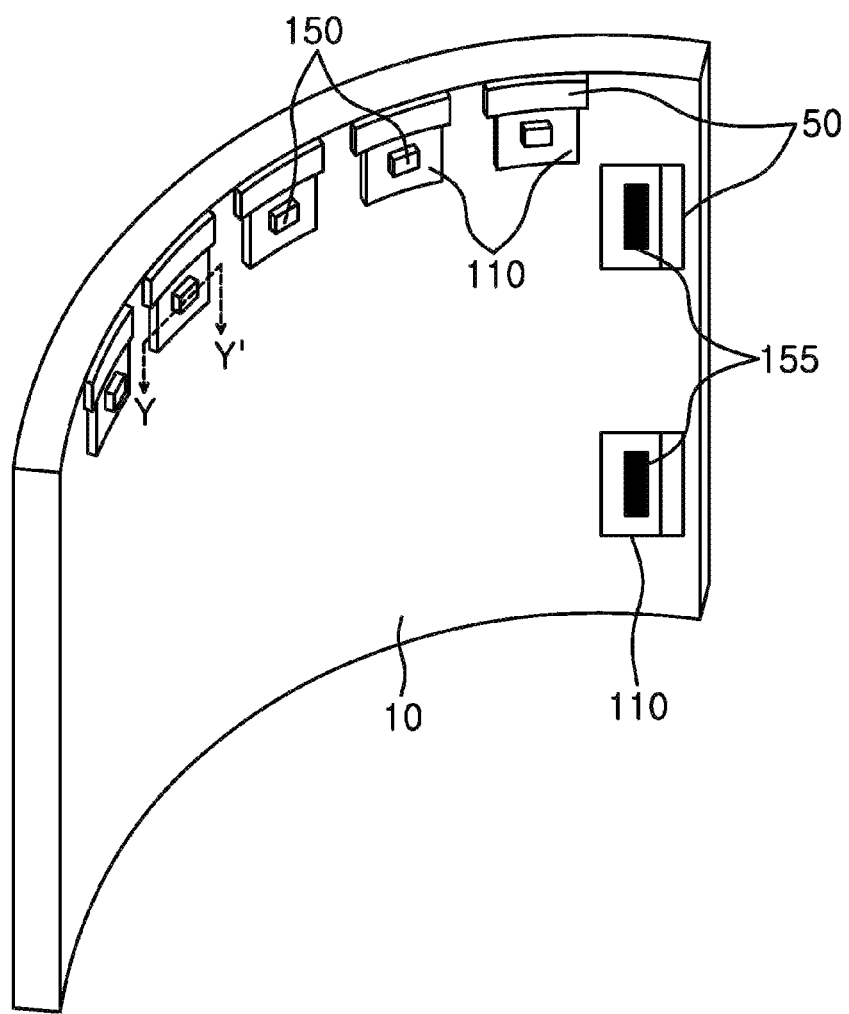
FIGS. 3A to 3C are diagrams of an example of display driver ICs attached to a second surface of a curved display panel.
Figure 3B:
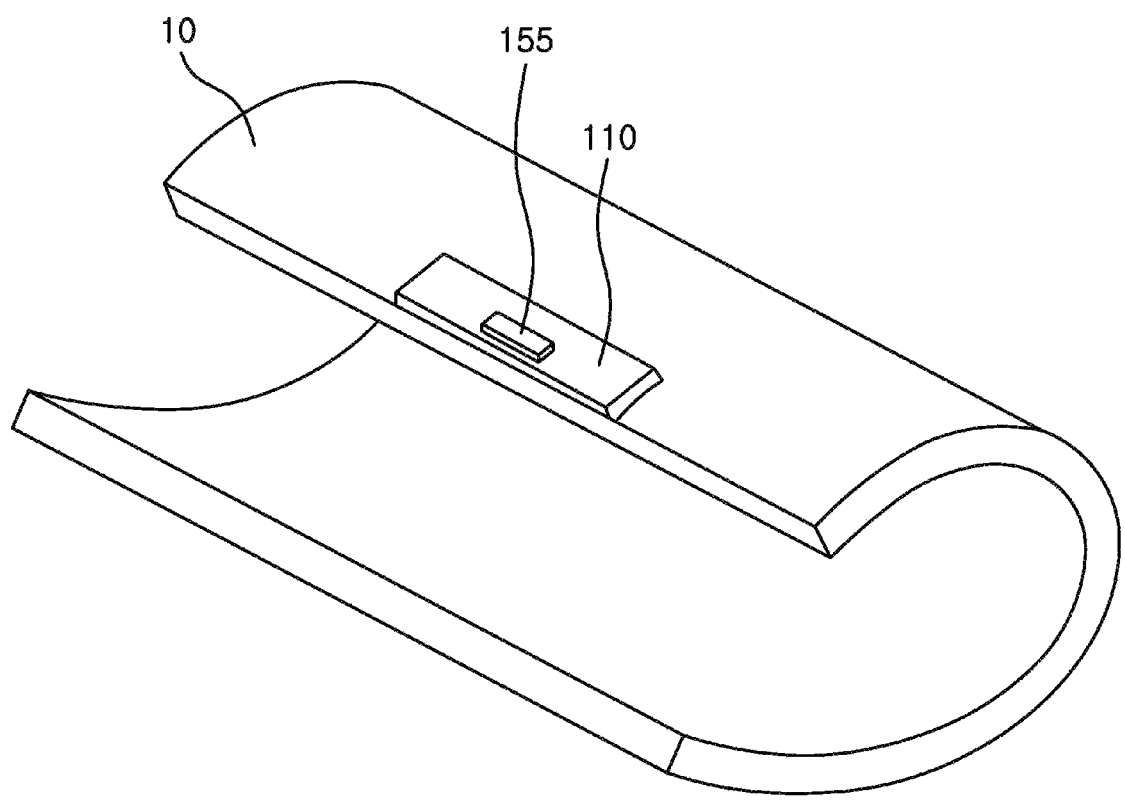
Figure 3C:
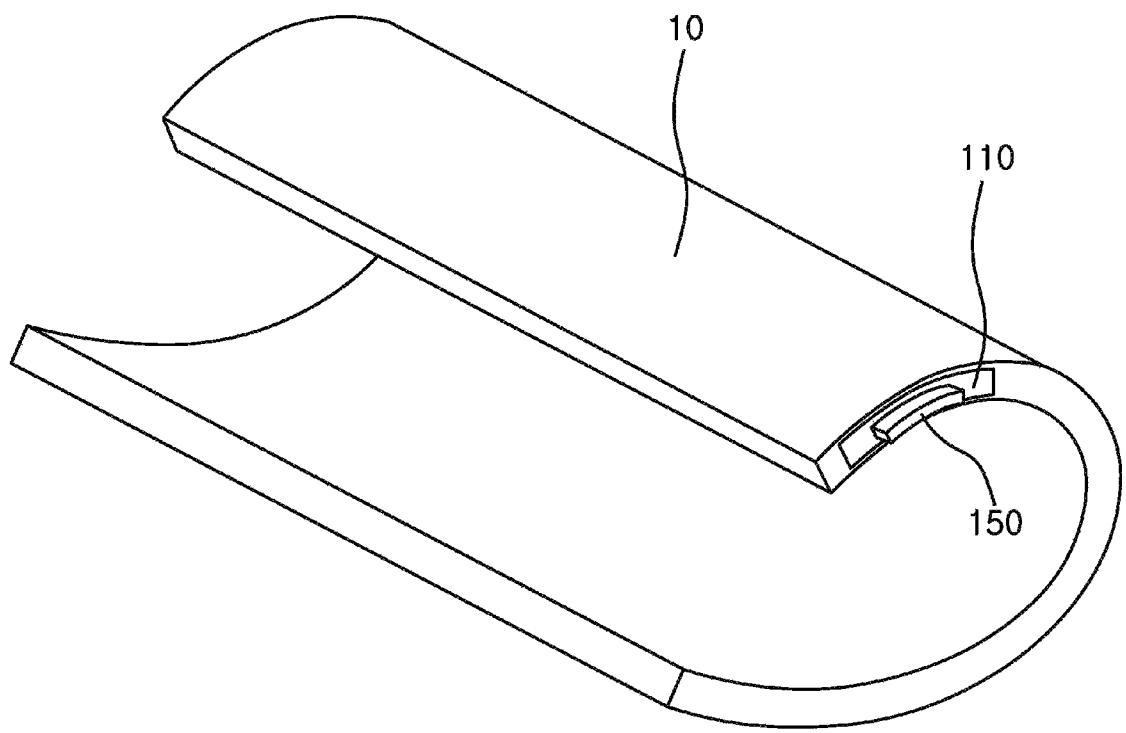

FIGS. 3A to 3C are diagrams of an example of display driver ICs attached to a second surface of a curved display panel.

In the example of FIG. 3A, a curved flexible film is attached to a second surface of a display panel 10 that is bent or curved. In such an example, the film is a curved flexible film 110. The flexible film 110 may be a Polyimide (PI) film. On the flexible film 110, there is disposed a semiconductor chip 150. The curved flexible film 110 is bent. However, the semiconductor chip 150 is flat or planar.

In the example of FIG. 3B, a display panel 10 is severely bent in one direction. In such an example, a film 110 is attached to a second surface of the display panel 10 that is bent, and a semiconductor chip 155 is attached to the film 110. In such an example, the film 110 and the semiconductor chip 155 both may be flat or planar because the display panel 10 is less bent in the long-axis direction of the film 110 and the semiconductor chip 155.

In the example of FIG. 3C, a display panel 10 is severely bent in one direction in a similar manner to that of FIG. 3B. In such an example, a film 110 is attached to a side of the display panel 10 that is bent, and a semiconductor chip 150 is attached to the film 110. In the example of FIG. 3, the film 110 and semiconductor chip 150 both may be bent, because the display panel 10 is bent more in the long-axis direction than the film 110 and semiconductor chip 155 of the display panel 10 of FIG. 3B.

Figure 4A:
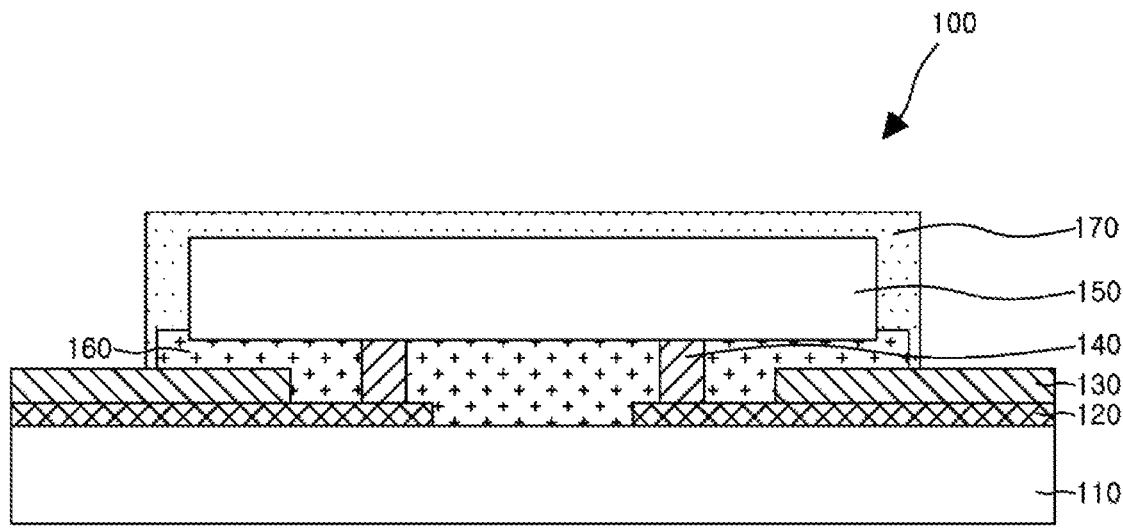
FIGS. 4A to 4C are diagrams of an example of a rigid or flexible semiconductor package.
Figure 4B:
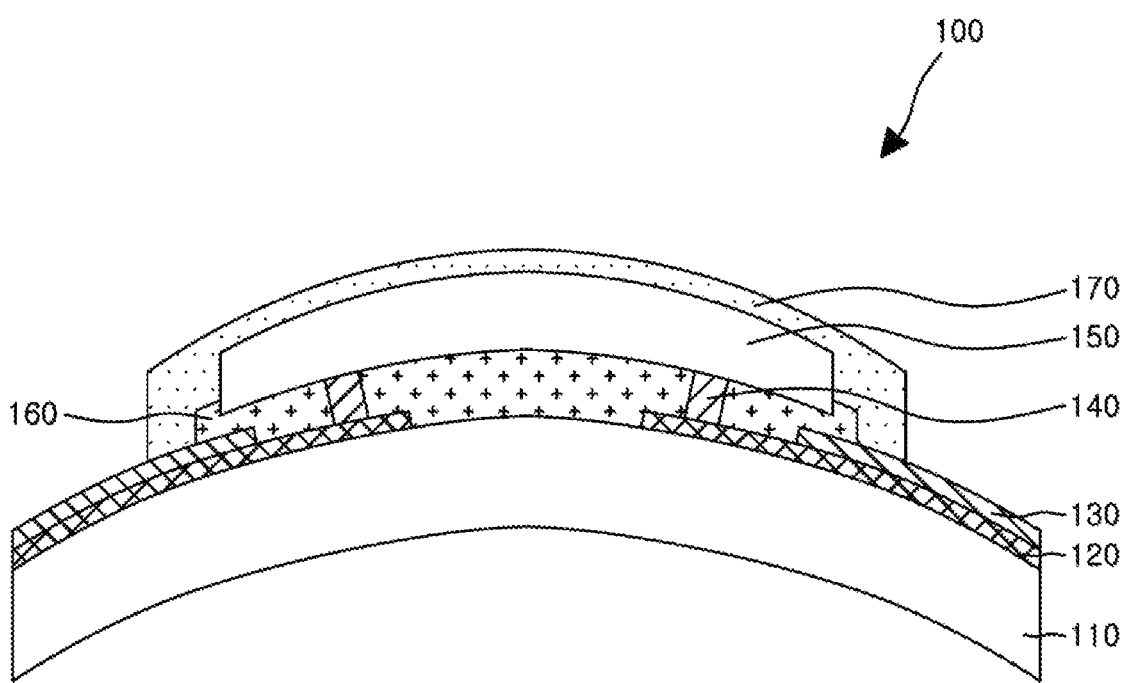
Figure 4C:
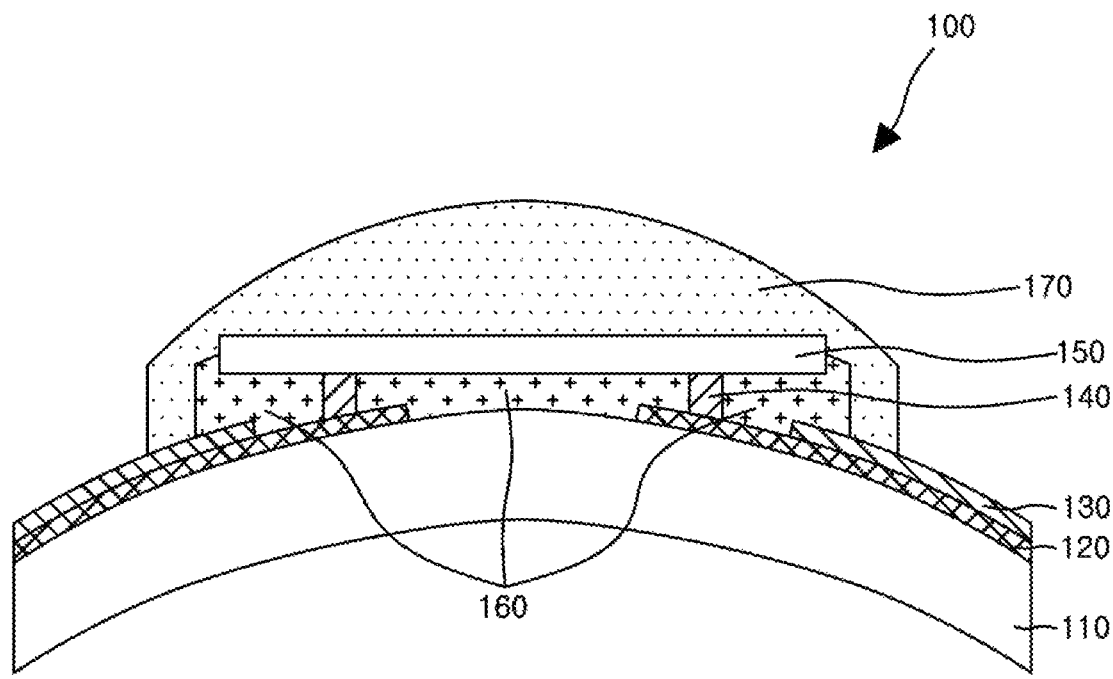

FIGS. 4A to 4C are diagrams of an example of a rigid or flexible semiconductor package.

The example of FIG. 4A is a cross section of FIG. 1A along the line X-X'. Such a form of a semiconductor package is suitable for use with a rigid display panel. In such an example, not only a semiconductor chip 150 that is a display driver IC, but also a flexible film 110, an underfill material 160, and a flexible cover layer 170 are not bent. Instead, the flexible film 110, the underfill material 160, and the flexible cover layer 170 each have a flat shape.

By contrast, the example of FIG. 4B is a cross section of one example of FIG. 3A along the line Y-Y'. In the example of FIG. 4B, not only a semiconductor chip 150 that is a display driver IC, but also a curved flexible film 110, an underfill material 160, and a flexible cover layer 170 are each bent, to a certain degree. Hence, each top surface of the curved flexible film 110, the underfill material 160, the flexible cover layer 170 and the semiconductor chip 150 is curved or bent. In such an example, both a top surface and a bottom surface of the semiconductor chip 150 are curved. The semiconductor chip 150 is bendable, because the semiconductor chip 150 has very thin thickness of 50 to 250 um. Therefore, a form of the semiconductor package as illustrated in the example of FIG. 4B is suitable for a curved display panel.

FIG. 4C is a cross section of another example of FIG. 3A along the line Y-Y'. The example of FIG. 4C corresponds to an example, in which, except that a semiconductor chip 150 that is a display driver IC is flat or planar in form, all elements of a curved flexible film 110, an underfill material 160, and a flexible cover layer 170 each bent or curved. Accordingly, each top surface of curved flexible film 110, an underfill material 160, and a flexible cover layer 170 is curved or bent. The semiconductor package of the example of FIG. 4C is applicable to use in a form of rigid or flexible of display panels. In the example that a semiconductor package 100 is attached to a curved display panel, a semiconductor package as illustrated in the example of FIG. 4C is formed. With respect to a stress on the semiconductor chip 150, the form of FIG. 4C places less stress than the form of the example of FIG. 4B. If the semiconductor chip 150 is bent as shown in the example of FIG. 4B, a motion velocity of hole or electron carriers flowing through a channel under a gate electrode potentially varies accordingly. Therefore, the form of the semiconductor chip 150 in the example of FIG. 5B presents an issue that a configured value desired for the successful operation of the semiconductor chip 150 is not output. For example, turning ON occurs at a lower voltage, or a leakage current may increase. In addition, there is potentially an empty space between various materials used in the production of the semiconductor chip 150, so such an empty space also potentially causes a problem. Therefore, it is preferable that the form of the semiconductor chip 150 is flat as shown in the example of FIG. 4C. By contrast, the flexible film 110, the underfill material 160, and the flexible cover layer 170 have a certain degree of elasticity or flexibility, so the elements are able to withstand stress due to curvature without significant ill effect even if these elements are somewhat curved. That is, these elements may operate and function properly while experiencing the stress occurring due to curvature. The form of the semiconductor package illustrated in the example FIG. 4C is well suited for an example in which a semiconductor package 100 is attached to a flexible display.

As illustrated in each of the examples of FIGS. 4A to 4C, an example of a semiconductor package 100 includes a flexible film 100, a plurality of metal wires 120, a solder resist 130, a plurality of bumps 140, a semiconductor chip 150, an underfill material 160, and a flexible cover layer 170. However, the semiconductor package 100 is not explicitly limited to the examples, and may optionally include or omit various elements in various examples. For example, the semiconductor chip 150 in these examples is directed to a display driver IC for driving a curved display panel 10, such as a source driver IC or gate driver IC, but the semiconductor chip 150 is not to be limited to these particular examples.

For example, the flexible film 110 is a package film for integrating a semiconductor, used in technology such as a Chip on Flexible Printed Circuit (COF), Tape Carrier Package (TCP), or Chip on Board (COB).

In particular, the flexible film 110 has a certain flexibility because the flexible film 110 is implemented as a material of, for example, Polyimide (PI)-based film. In examples, one side of the flexible film 110 is connected to a terminal of Anisotropic Conductive Film (ACF) panel, and the other side is connected to an image device board. That is, the semiconductor chip 150, terminal of an ACF panel, and image system board are electrically connected to each other through the metal wire 120 on the flexible film 110.

The plurality of metal wires 120 area formed on the flexible film 110 so that their ends are disposed at a predetermined area designated for accepting a semiconductor chip. In such an example, the metal wire 120 is a conductive material. For example, the metal wire 120 is implemented as being a copper pattern, or as a pattern of Copper (Cu) plated with Tin(Sn), Gold(Au), Nickel(Ni), and/or another appropriate conductive metal. Therefore, the metal wire 120, implemented as the conductive material, is electrically connected to the semiconductor chip 150 via the plurality of bumps 140 to support, accordingly, the transference of a signal by the semiconductor chip 150.

In addition, in an example, the metal wire 120 includes a dummy pattern. In such an example, the dummy pattern is not connected to an electrical signal line, but in other examples, the dummy pattern is connected to the electrical signal line, if required. In addition, the metal wire and the dummy pattern are formed as a multi-layer structure.

The solder resist 130 is formed on the metal wire 120 in order to cover a complete area, except for the terminals, of the metal wire 120. That is, the solder resist 130 is patterned on the metal wire 120, so the solder resist 130 is able to protect the metal wire 120, implemented as a conductive material as discussed further, above, and insulates the semiconductor chip 150 from other components.

For example, the plurality of bumps 140 are formed on a terminal of a metal wire 120, on which the solder resist 130 is not formed, as discussed further, above. Therefore, the plurality of bumps 140 are directly connected to the metal wire 120. Such a structure enables the semiconductor chip 150 to be electrically connected to the metal wire 120 via the conduction through the bumps themselves.

The semiconductor chip 150 includes a first surface and a second surface. For example, the second surface is the reverse of the first surface. The first surface is attached to the flexible film 110, and the cover layer 10 with flexibility is formed on the second surface. In such an example, the semiconductor chip 150 is electrically connected to a plurality of bumps 140, so the semiconductor chip 150 is electrically connected to the metal wire 120 via the plurality of bumps 140. In one example, the semiconductor chip 150 is bonded and connected to the plurality of bumps 140 by using the heat of bucking equipment.

The semiconductor chip 150 of the examples has, for example, a thickness of about 20 to 300 μm. Such a range is chosen because, as the thickness of a semiconductor chip becomes thinner, a flexibility increases, the possibility that a track phenomenon occurs resulting from a transformation is lower, and the limitation to the package thickness of the post process is minimized.

The underfill material 160, which is present for increasing adhesion between the first surface of the semiconductor chip 150 and the flexible film 110 and protecting a plurality of bumps 140, is formed in an empty space between the semiconductor chip 150 and the first surface of the semiconductor chip 150 and the flexible film 110. In addition, in an example, the underfill material 160 is formed to partially cover an exposed metal wire 120 to connect the plurality of bumps 140 and the semiconductor chip 150. Also, the underfill material 160 optionally fills the solder resist 130 to include at least a portion of both sides of the semiconductor chip 150.

The underfill material 160 is implemented as including non-conductive materials, such as an epoxy-based material, an acryl-based material, a or silicon-based material to insulate the inside of the plurality of bumps 140. However, these are only examples and other insulating materials are used in other examples. In various examples, the underfill material 160 is formed by being potted using a method of dispensing, squeegee printing, or spray and being cured at room temperature, in an oven, or by being subject to UV rays.

In one example, the dispensing method is a method of injecting an underfill material implementation material, as discussed above into a space under the semiconductor chip 150, such as by using a needle.

The squeegee printing method is a method of rubbing the underfill material implementation material using a plunger, and so on, such that the underfill material implementation material flows, as a result, into a space under the semiconductor chip 150.

The spray method is a method of spraying an underfill material implementation material, as discussed further, above, into a space under the semiconductor chip 150 by using a semiconductor nozzle.

The flexible cover layer 170 helps heat release of the semiconductor chip 150. Thus, the flexible cover layer 170 is also referred to as a heat releasing layer. A great deal of heat is generated when the semiconductor chip 150 is driven. Therefore, the semiconductor chip potentially includes a metal material or filler so that heat is able to be released more easily via the flexible cover layer 170. In addition, the flexible layer 170 is used for increasing the amount of adhesion, so that the semiconductor chip 150 is more likely to be attached to the flexible film 110, and the flexible layer 170 is formed on the semiconductor chip 150 so as to cover a side and front side of the semiconductor chip 150.

The flexible layer 170, which may act as a flexible cover layer and/or a flexible protection layer 170, is implemented, for example, as a non-conductive silicon-based material with a characteristic of flexibility. In particular, in an example, the flexible cover layer 170 of the example is non-conductive. The property of being non-conductive is chosen in order to prevent, in advance, electrical issues and problems from occurring between the semiconductor chip 150 and flexible film 110, using the flexible cover layer 170. The non-conductive flexible cover layer 170 protects the top surface of the semiconductor chip. Accordingly flexible cover layer 170 is also referred to as a protection layer. In such an example, the protection layer 170 has a curved top surface.

For example, the flexible cover layer 170 includes either one or both of a heat conductive filler material and a curable material that responds to radiating heat. A resin material is an example one of the materials that may be chosen as the curable materials, but other materials are options for use as a curable material.

In this example, the heat conductive filler material is implemented for example, as any one or any combination of any two or more of alumina ($Al_2O_3$), boron nitride, aluminum nitride, and diamond. Alternatively, in such an example, the alumina is possibly replaced with one of carbon nitride and graphene. Alumina ($Al_2O_3$), boron nitride, aluminum nitride, diamond, carbon nitride, and graphene, and so on, have superior heat conductivity. Thus, the heat conductive filler material is one of these materials in an example, though other examples are possible using other materials with similar physical properties.

The flexible cover layer 170 is formed of a mixture of a non-conductive silicon-based material and a heat conductive filler material with a function of radiating heat. The higher the percentage of a non-conductive silicon-based material with flexibility that is present in the flexible cover layer 170, the greater the flexibility or elasticity of the flexible cover layer 170 is. When the percentage of the filler material is higher than the percentage of the non-conductive material, the heat conductivity increases instead of the flexibility. Therefore, when the flexible cover layer is applied to a flexible display, the percentage of the silica non-conductive material may be higher than the percentage of the non-conductive material in the examples. Also, in an example, the volume or weight ratio of the silica non-conductive material is relatively high.

For example, the flexible cover layer 170 has a thickness of 0.1 to 0.8 mm, which is chosen for ensuring the adhesion between the semiconductor chip 150 and the flexible film 110 and for preventing a package from being too thick due to the thickness of the flexible cover layer 170.

For example, the flexible cover layer 170 is formed in the same manner as that used with respect to the underfill material 160. That is, the flexible cover layer 170 is formed by being potted by using a method of dispensing, squeegee printing, or spraying and being hardened at room temperature, in an oven, or by being subject to UV rays. However, the time for curing the flexible cover layer 170 is potentially shorter than the curing time of the underfill material 160, which results from the differences of material, exposed area, thickness, and so on between the flexible cover layer 170 and the underfill material 160.

As described further above, the semiconductor package of the examples increases the adhesive force between the semiconductor chip 150 and the flexible film 110, while simultaneously minimizing the thickness increase of the semiconductor chip occurring due to the flexible cover layer 170. Thus, as the flexibility of the semiconductor package 150 increases, so too the radius of curvature of the semiconductor chip 150 is minimized when the semiconductor package is transformed, as illustrated in the example of FIG. 4C. Also, by using such an approach, the possibility of the characteristic deterioration and damage of the semiconductor chip is reduced.

Figure 5A:
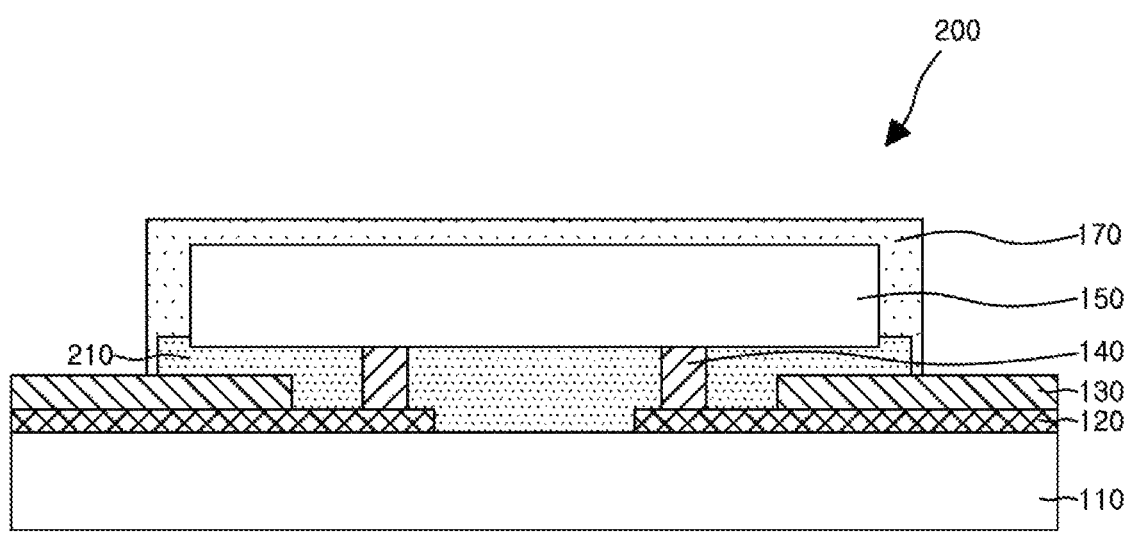
FIGS. 5A to 5C are diagrams of another example of a rigid or flexible semiconductor package.
Figure 5B:
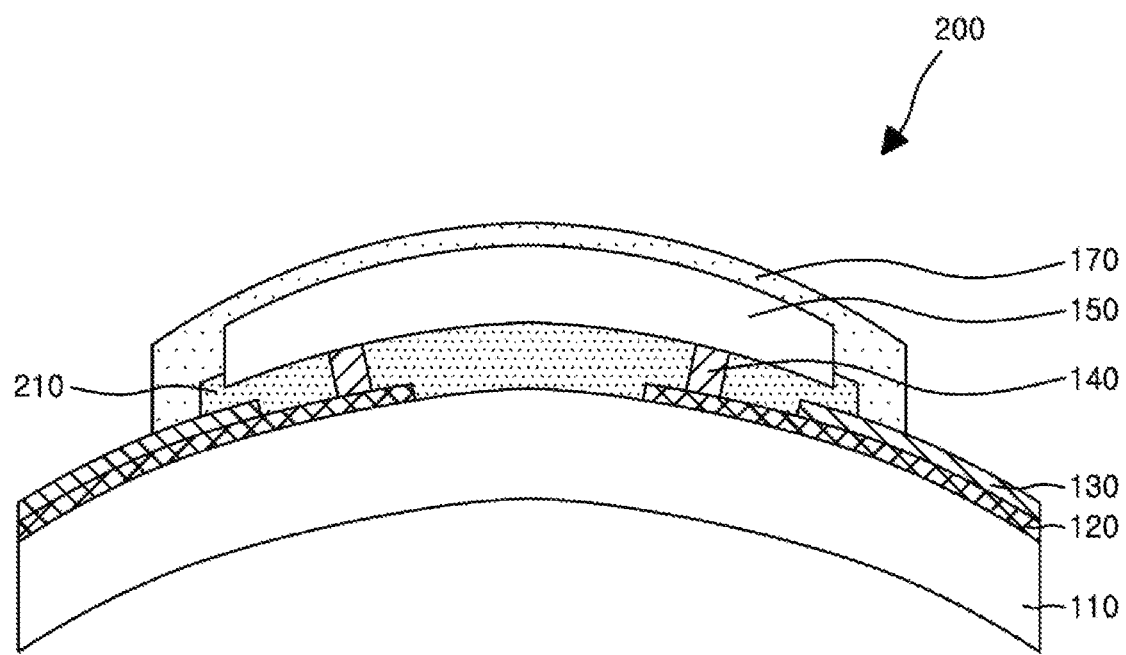
Figure 5C:
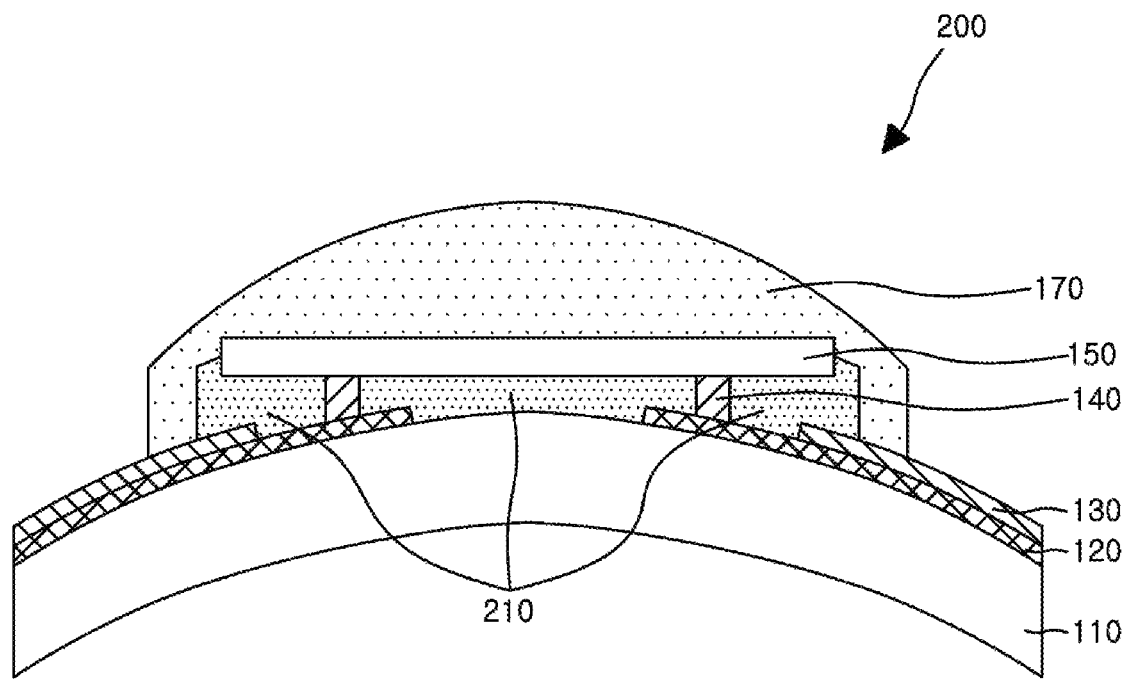

FIGS. 5A to 5C are diagrams of another example of a rigid or flexible semiconductor package.

FIG. 5A illustrates an example where not only a semiconductor chip 150 that is a display driver IC but also a flexible film 110, an underfill material 210, and a flexible cover layer 170 all are flat without being bent or flexed, so the semiconductor package form of the example of FIG. 5A is suitable for a rigid display panel.

By contrast, the example of FIG. 5B illustrates an example where not only the semiconductor chip 150 that is a display driver IC, but also the flexible film 110, the underfill material 210, and the flexible cover layer 170 are all somewhat bent. Thus, the semiconductor package form of FIG. 5B is suitable for use in a curved display panel.

FIG. 5C illustrates an example where the semiconductor chip 150 that is a display driver IC is flat, but the flexible film 110, the underfill material 210, and the flexible cover layer 170 are each bent. Therefore, the semiconductor package form of the example of FIG. 5C is applicable to either rigid or curved display panels. When a semiconductor package 100 is attached to a flexible display, it takes a form as illustrated in the example of FIG. 5C. It is to be noted that that the stress on the semiconductor chip 150 in the example of FIG. 5C is less than that of the example of FIG. 5B.

The change in stress occurs because, if the semiconductor chip 150 is bent, a motion velocity of hole or electron carriers that flow through a channel under a gate electrode potentially varies. Therefore, the form of the semiconductor chip 150 presents an issue that a configured value is not output, and turning ON of the semiconductor chip 150 potentially occurs at a lower voltage or a leakage current potentially increases. In addition, in some examples, there is an empty space among various materials used in the production of the semiconductor chip 150, which potentially causes other operational problems. Therefore, it is preferable that the form of the semiconductor chip 150 is flat or planar rather than being bent or curved. By contrast, the flexible film 110, underfill material 210, flexible cover layer 170 each may have a certain degree of elasticity or flexibility, so they withstand stress due to curvature even if they are somewhat curved. That is, these elements are observed to operate properly regardless of the presence of the stress due to curvature. In the example that a semiconductor package 100 is attached to a flexible display, the example of FIG. 5C may be the best approach.

As illustrated in the examples of FIGS. 5A to 5C, another example of a semiconductor chip package 200 of the examples includes a flexible film 110, a metal wire 120, a solder resist 130, a plurality of bumps 140, a semiconductor chip 150, an underfill material 210, a flexible cover layer 170. However, the semiconductor package 100 is not explicitly limited to the examples, and may optionally include or omit various elements. In the examples of FIGS. 5A-5C, the underfill material 210 is used for increasing an adhesive force between a first surface of the semiconductor chip 150 and the flexible film 110 and for protecting the plurality of bumps 140, so the underfill material 210 has higher adhesive force than the flexible cover layer 170. Accordingly, the underfill material 210 is to be implemented as a material having a higher viscosity than the flexible cover layer 170. In addition, similar to the flexible cover layer 170, the underfill material 210 also includes a material that increases flexibility of the semiconductor package 200 to have a relatively high flexibility. As mentioned above, in order to increase flexibility, both the underfill layer 210 and flexible cover layer 170 are formed, for example, of a material such as non-conductive materials, which may be silicon-based materials. In examples, the underfill and flexible cover layers are characterized by their formation using the same substance or material as one another. Since the same material is used to form both the underfill layer 210 and flexible cover layer 170, a manufacturing process may be simpler and the cost may be reduced.

In further detail, the underfill material 210 and the flexible cover layer 170 are potentially formed by application of a coating liquid and subsequently being cured twice. For example, the underfill material 210 is formed first by potting or underfilling a non-conductive silicon-based material between a first surface of the semiconductor chip 150 and the flexible film 110, and then conducting an oven curing at a temperature of about 125 to 175° C. for 20 to 40 minutes. After that, the flexible cover layer 170 is formed by potting the non-conductive silicon-based material to cover a second surface of the semiconductor chip 150, and then conducting the oven curing again, the temperature being about 125 to 175° C., for about 30 minutes to 2 hours.

Figure 6A:
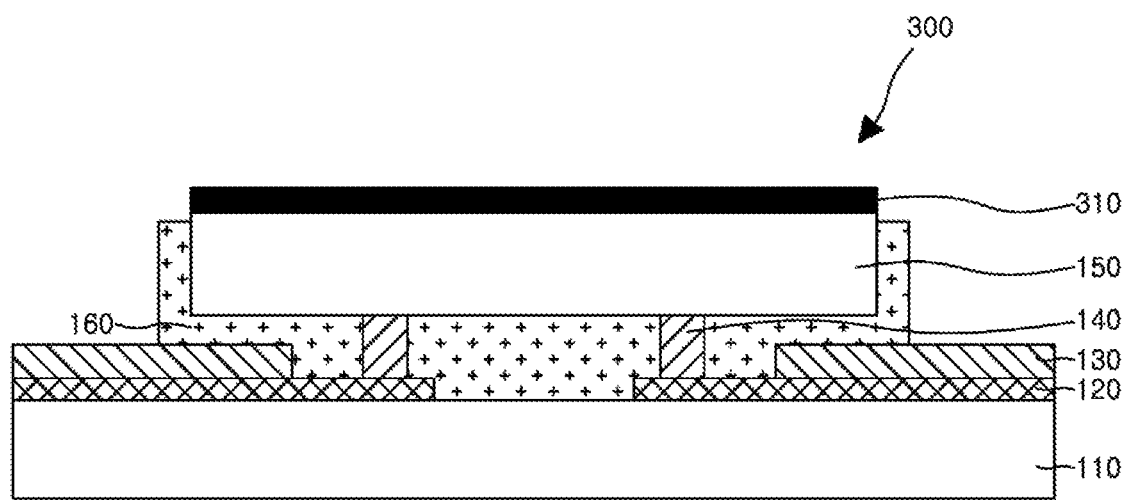
FIGS. 6A to 6C are diagrams of another example of a rigid or flexible semiconductor package.
Figure 6B:
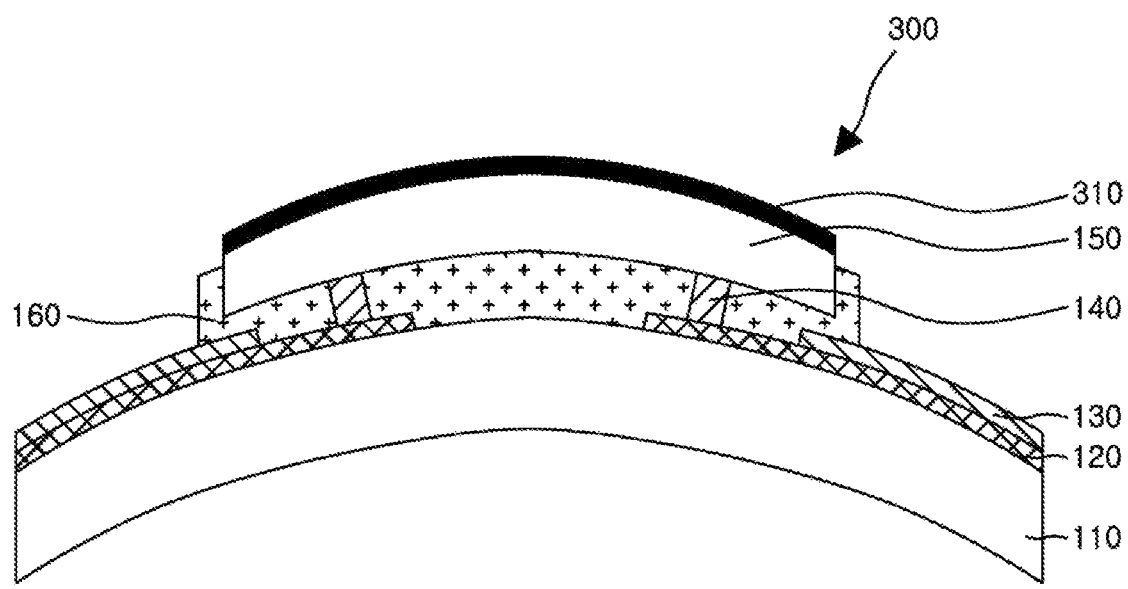
Figure 6C:
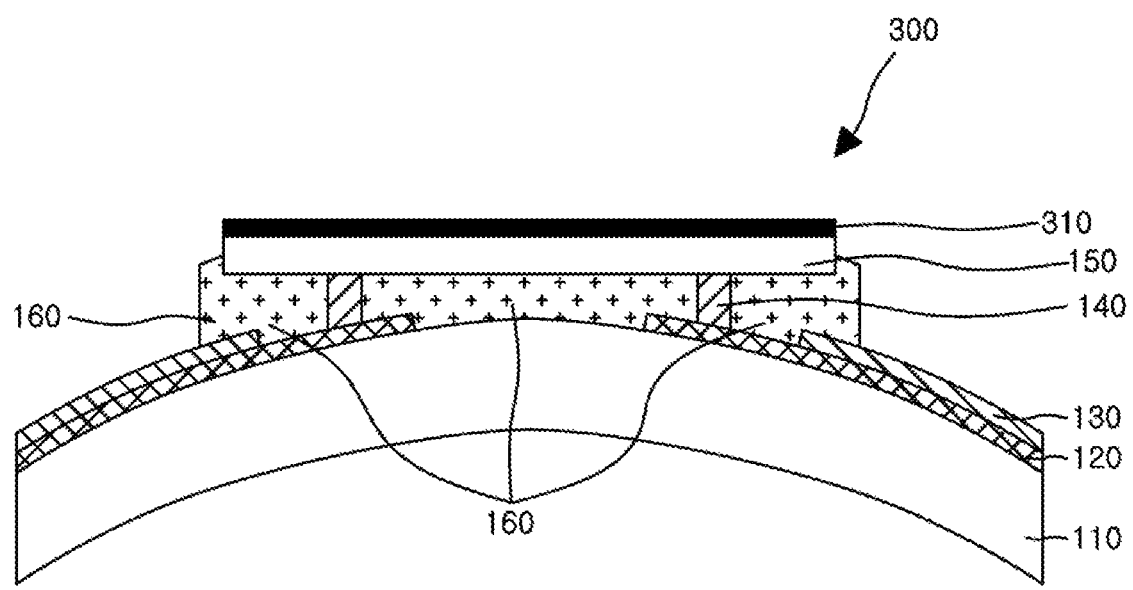

FIGS. 6A to 6C are diagrams of another example of a rigid or flexible semiconductor package.

FIG. 6A corresponds to the form of a semiconductor package that is suitable for a rigid display panel. FIG. 6B corresponds to the form of a semiconductor package that is suitable for a curved display panel. Such a capability is enabled by the flexibility of a flexible tape 310. FIG. 6C corresponds to a form of a semiconductor package that is applicable to both rigid and curved display panel.

As illustrated in the examples of FIGS. 6A to 6C, another example of a semiconductor chip package 300 includes a flexible film 110, a metal wire 120, a solder resist 130, a plurality of bumps 140, a semiconductor chip 150, an underfill material 160, and a flexible tape 310. In the examples of FIGS. 6A to 6C, a flexible cover layer 170 is replaced with the flexible tape 310. However, the semiconductor package 100 is not explicitly limited to the examples, and may optionally include or omit various elements.

In further detail, in the examples of FIGS. 6A to 6C, the semiconductor chip package 300 is easily implemented by forming the flexible film 110, the metal wire 120, the solder resist 130, the plurality of bumps 140, the semiconductor chip 150, and the underfill material 160 in serial order, and then attaching and curing the flexible tape 310 to a second surface of the semiconductor chip 150.

For example, the flexible tape 310 is implemented as a non-conductive silicon-based material, and the flexible tape 310 may further include either one or both of heat conductive filler with a radiation function and a curable material depending on a situation. The thickness of the flexible tape 310 is configured to vary depending on a semiconductor process but to fall in a range of about 10 to 50 um, which is a thickness that is less than the thickness of the flexible cover layer 170, as described above.

In the examples of FIGS. 6A to 6C, the flexible tape 310 is cured under a condition of curing at room temperature, in an oven, or by being subject to UV rays. However, curing the flexible tape 310 takes less time than curing the flexible cover layer 170. For example, the flexible tape 310 is cured by oven curing at a temperature of about 125 to 175° C. for more than 15 minutes.

Figure 7:
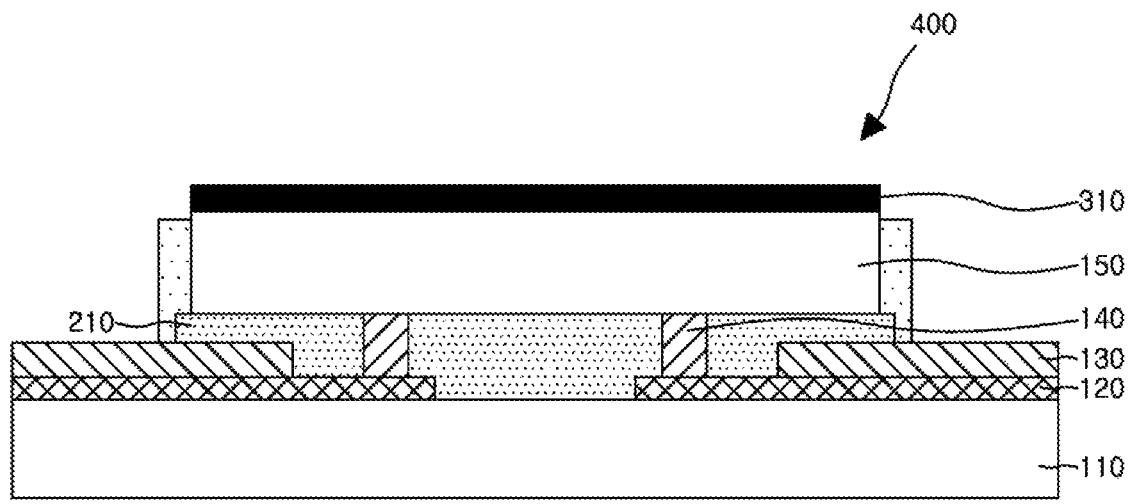
FIG. 7 is a diagram of another example of a semiconductor package.

FIG. 7 is a diagram of another example of a semiconductor package.

As illustrated in the example of FIG. 7, another example of a semiconductor chip package 400 includes a flexible film 110, a metal wire 120, a solder resist 130, a plurality of bumps 140, a semiconductor chip 150, an underfill material 210, a flexible tape 310 on a second surface of the semiconductor chip 150.

The underfill material 210 is formed by initially potting or performing an underfill process of a non-conductive silicon-based material between a first surface of the semiconductor chip 150 and the flexible film 110. The underfill material 210 formation is completed by conducting an oven curing at a temperature of about 125 to 175° C. for about 10 to 20 minutes. When the formation of the underfill material 210 is complete, the flexible tape 310 is then formed by attaching the flexible tape 310 to a second surface of the semiconductor chip 150, and then conducting the oven curing at a temperature of about 125 to 175° C. for about 10 to 20 minutes.

In order to ensure that the underfill material 210 has a same flexibility as the flexible cover layer 170, the underfill material 210 includes a material helpful for increasing the flexibility of the underfill material 210. As described above, in order to increase flexibility for both of the underfill material 210 and the flexible cover layer 170 in the example of FIG. 7, both of the underfill material 210 and the flexible cover layer 170 are formed as including a non-conductive silicon-based material. In the example of FIG. 7, the underfill and flexible cover layers are again characterized by the formation using the same substance or material. Again, because the same material is used for both layers, a manufacturing process may be simplified and the cost may be reduced.

FIGS. 8A to 8D are diagrams of an example of a method for manufacturing a semiconductor package.

Figure 8A:
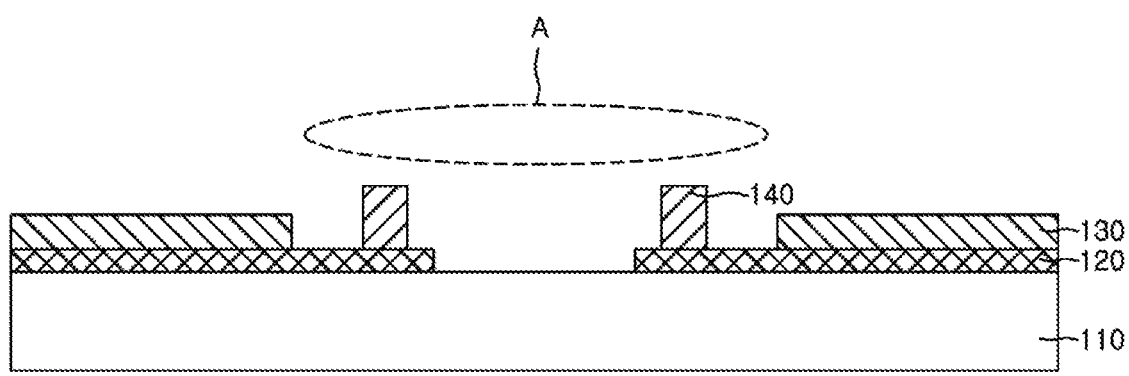
FIGS. 8A to 8D are diagrams of an example of a method for manufacturing a semiconductor package.

As illustrated in the example of FIG. 8A, an end of a metal wire 120 is exposed by removing a part of the solder resist 130 previously formed in a semiconductor acceptance area A, after forming the metal wire 120 and a solder resist 130 in serial order to correspond to a signal line of a semiconductor chip 150 on a flexible film 110. In such an example, the removing of the metal wire 120 may be conducted by an etching process using a photo etching process. Furthermore, a plurality of bumps 140 are formed at an end of the metal wire 120 based on the positioning of semiconductor acceptance area A.

Figure 8B:
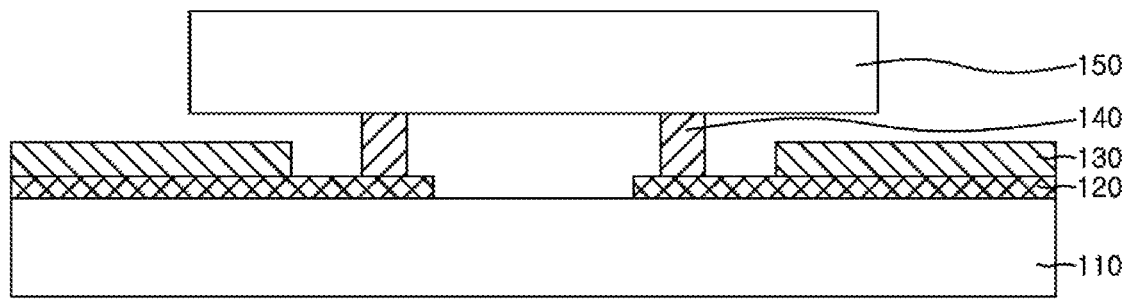

As illustrated in the example of FIG. 8B, a semiconductor chip 150 is electrically connected to be formed on top of the plurality of bumps 140. As a result of the example of FIG. 8B, the semiconductor chip 150 is electrically connected to the metal wire 120 through the plurality of bumps 140.

Figure 8C:
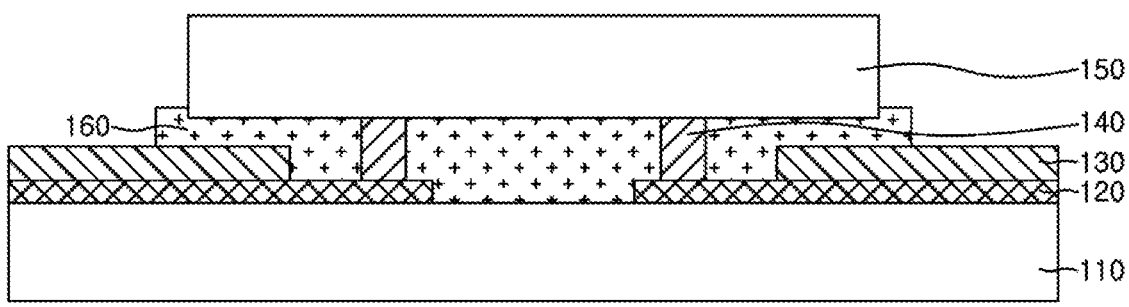

As illustrated in the example of FIG. 8C, an underfill material 160 is formed by being potted and cured between a first surface of the semiconductor chip 150 and the flexible film 110. In the example of FIG. 8C, the potting process is one of a method of dispensing, squeegee printing, or spray, and the curing process is, for example conducted under a condition of being at room temperature, being in the oven, or by being subject to UV rays.

Figure 8D:
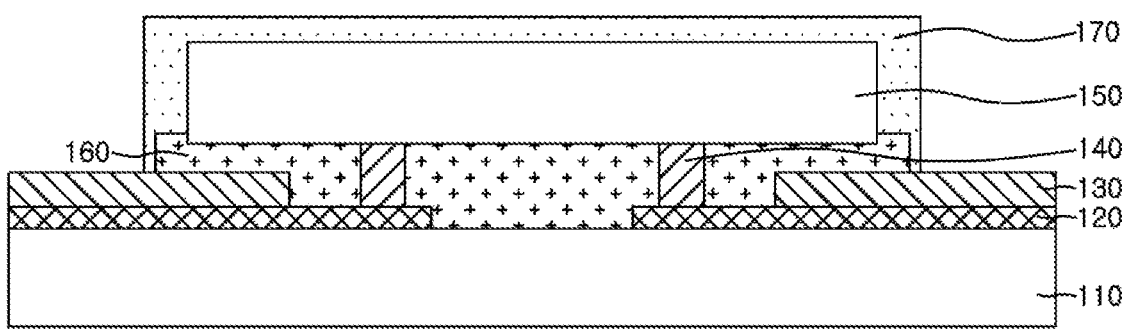

As illustrated in the example of FIG. 8D, a flexible cover layer 170 is formed on a second surface of the semiconductor chip 150 to cover the second surface. In this example, the flexible cover layer 170 is formed in a similar way of potting and hardening processes of the underfill material 160, as discussed further above. For example the potting process is one of a method of dispensing, squeegee printing, or spray, as used in the underfill material 160. Also the curing process is, for example, conducted under a condition of being at room temperature, being in the oven, or by being subject to UV rays.

However, the curing time of the flexible cover layer 170 is less than that of the underfill material 160. For example, when hardening each of the underfill material 160 and the flexible cover layer 170 occurs via an oven curing process, the underfill material 160 is cured at a temperature of about 125 to 175° C. for 1 to 3 hours, but the flexible cover layer 170 is cured at a temperature of about 125 to 175° C. for about 0.5 to 2 hours.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor package attached to a curved display panel, comprising:

a semiconductor chip, having a top surface and a side surface, disposed on a curved flexible film, wherein the curved flexible film is disposed on the curved display panel;

a flexible cover layer attached to the top surface and the side surface of the semiconductor chip; and an underfill material formed between the semiconductor chip and the curved flexible film, and overlapping a solder resist, wherein the flexible cover layer is in direct contact with the underfill material, the solder resist, and the top and side surfaces of the semiconductor chip, and wherein the top surface of the semiconductor chip on the curved flexible film remains flat.

2. The semiconductor package of claim 1, wherein the flexible cover layer is formed to cover the top surface and the side surface of the semiconductor chip.

3. The semiconductor package of claim 1, wherein the semiconductor chip has a thickness of 50 to 250 µm.

4. The semiconductor package of claim 1, wherein the flexible cover layer has a thickness of 0.1 to 0.8 mm.

5. The semiconductor package of claim 1, wherein the flexible cover layer comprises a mixture of a non-conductive silicon-based material and a conductive filler material.

6. The semiconductor package of claim 5, wherein the flexible cover layer further comprises resin material.

7. The semiconductor package of claim 5, wherein a percentage of the non-conductive silicon-based material in the flexible cover layer is greater than a percentage of the conductive filler material in the flexible cover layer.

8. The semiconductor package of claim 5, wherein the filler material is any one or any combination of any two or more of alumina, aluminum nitride, boron nitride, carbon nitride, graphene, and diamond.

9. The semiconductor package of claim 1, further comprising metal wires formed on the flexible film comprising terminals configured to accept the semiconductor chip.

10. The semiconductor package of claim 9, further comprising bumps formed on the metal wires, wherein the bumps connect the metal wires to the semiconductor chip.

11. The semiconductor package of claim 9, wherein the solder resist is formed on the metal wires to cover a complete area, except for the terminals, of the metal wires.

12. The semiconductor package of claim 1, wherein the semiconductor chip comprises a source driver IC or a gate driver IC.

13. The semiconductor package of claim 1, wherein the underfill material has a higher viscosity than the flexible cover layer.

14. The semiconductor package of claim 1, wherein the underfill material comprises non-conductive silicon-based materials and conductive filler materials.

15. The semiconductor package of claim 1, wherein the flexible cover layer has a shape of a tape.

16. The semiconductor package of claim 1, wherein the underfill material and the flexible cover layer comprise a same material.

17. A semiconductor package attached to a curved display panel having front, rear and side surfaces, comprising:

a semiconductor chip having a top surface, a side surface and a bottom surface disposed on a curved flexible film, wherein the curved flexible film is disposed on the curved display panel;

an underfill material formed between the semiconductor chip and the curved flexible film and overlapping a solder resist; and a flexible cover layer formed on the top surface and the side surface of the semiconductor chip and being in direct contact with the underfill material, the solder resist, the top surface and the side surface of the semiconductor chip, wherein the semiconductor chip on the curved flexible film is attached to the side surface of the curved display panel, and wherein the bottom surface of the semiconductor chip on the curved flexible film is curved.

18. The semiconductor package of claim 17, wherein the underfill material and the flexible cover layer comprise a same material.

19. The semiconductor package of claim 17, wherein the underfill material and the flexible cover layer comprise non-conductive silicon-based materials and conductive filler materials, and wherein a percentage of the non-conductive silicon-based materials is greater than a percentage of the conductive filler materials.

20. The semiconductor package of claim 1, wherein the flexible cover layer is in direct contact with the semiconductor chip.

21. The semiconductor package of claim 17, wherein a central portion of the flexible cover layer disposed on the semiconductor chip is thicker than an edge portion of the flexible cover layer.

22. The semiconductor package of claim 17, wherein the flexible cover layer has a thickness in a range of 0.1 to 0.8 mm.

23. A semiconductor package attached to a curved display panel, comprising:

a semiconductor chip attached to a curved flexible film to be disposed on the curved display panel;

a flexible tape attached to an upper surface of the semiconductor chip; and an underfill material overlapping a solder resist and formed between a lower surface of the semiconductor chip and the curved flexible film, wherein the flexible tape comprises either one or both of heat conductive filler and a curable material.

24. The semiconductor package of claim 23, wherein the flexible tape is made of a non-conductive silicon-based material.

25. The semiconductor package of claim 23, wherein the flexible tape has a thickness in a range of 10 to 50 µm.

26. The semiconductor package of claim 23, further comprising a flexible cover layer having a thickness larger than that of the flexible tape.

27. The semiconductor package of claim 23, wherein both edges of the flexible tape attached to the upper surface of the semiconductor chip coincide with both edges of the semiconductor chip.

* * * * *